United States Patent
Lee (10) Patent No.: US 10,335,836 B2
(45) Date of Patent: Jul. 2, 2019

(54) METHOD AND APPARATUS FOR TREATING SUBSTRATE

(71) Applicant: Semes Co., Ltd., Chungcheongnam-do (KR)

(72) Inventor: Taekyoub Lee, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 355 days.

(21) Appl. No.: 15/195,262

(22) Filed: Jun. 28, 2016

(65) Prior Publication Data
US 2017/0001221 A1    Jan. 5, 2017

(30) Foreign Application Priority Data

Jun. 30, 2015  (KR) .................... 10-2015-0093162

(51) Int. Cl.
  *B08B 3/02*  (2006.01)
  *H01L 21/02*  (2006.01)
  *H01L 21/67*  (2006.01)

(52) U.S. Cl.
  CPC ........ *B08B 3/024* (2013.01); *H01L 21/02041* (2013.01); *H01L 21/6715* (2013.01); *H01L 21/67051* (2013.01); *B08B 2203/0229* (2013.01)

(58) Field of Classification Search
  CPC ............ B08B 3/024; B08B 2203/0229; H01L 21/02041; H01L 21/67051; H01L 21/6715
  See application file for complete search history.

(56) References Cited

U.S. PATENT DOCUMENTS

| 5,879,225 A * | 3/1999 | Kudo ............... B24B 37/105 451/271 |
| 6,371,667 B1 | 4/2002 | Kitano et al. |
| 8,793,898 B2 | 8/2014 | Jeong et al. |
| 9,355,835 B2 | 5/2016 | Lee |
| 9,953,826 B2 | 4/2018 | Kaneko et al. |
| 2003/0168078 A1* | 9/2003 | Deguchi ............ B08B 3/02 134/1.3 |

(Continued)

FOREIGN PATENT DOCUMENTS

| CN | 103531503 A | 1/2014 |
| CN | 103706499 A | 4/2014 |

(Continued)

OTHER PUBLICATIONS

Machine Translation for KR100873937B1, "Apparatus for Cleaning Wafer and Method for Wafer"; Oh Se Hoon et al. (Year: 2008).*

(Continued)

*Primary Examiner* — Sharidan Carrillo
(74) *Attorney, Agent, or Firm* — Jenkins, Wilson, Taylor & Hunt, P.A.

(57) ABSTRACT

A method for treating a substrate with a treatment liquid is disclosed, wherein the substrate is treated while a location at which the treatment liquid is supplied onto the substrate that is rotated is moved in an outward direction from a central area of the substrate towards a peripheral area of the substrate and in an inward direction from a peripheral area of the substrate towards a central area of the substrate a plurality of times, and wherein the movement distances of some of the plurality of movements are different from each other.

12 Claims, 6 Drawing Sheets

(56) References Cited

U.S. PATENT DOCUMENTS

| | | | |
|---|---|---|---|
| 2006/0177777 A1* | 8/2006 | Kawamura | G03F 7/11 430/322 |
| 2007/0137677 A1* | 6/2007 | Nanba | H01L 21/02057 134/33 |
| 2010/0216078 A1* | 8/2010 | Yamamoto | G03F 7/3021 430/434 |
| 2014/0190633 A1 | 7/2014 | Maeda et al. | |
| 2015/0194301 A1* | 7/2015 | Uemura | G03F 7/422 134/18 |
| 2015/0241786 A1* | 8/2015 | Chen | G03F 7/3021 430/311 |
| 2017/0001221 A1* | 1/2017 | Lee | B08B 3/024 |

FOREIGN PATENT DOCUMENTS

| | | |
|---|---|---|
| CN | 103824757 A | 5/2014 |
| CN | 104637784 A | 5/2015 |
| JP | H11-121420 A | 4/1999 |
| JP | 2004-087800 A | 3/2004 |
| KR | 10-2000-0071551 A | 11/2000 |
| KR | 10-2005-0043142 A | 5/2005 |
| KR | 10-0757882 B | 7/2007 |
| KR | 100873937 B1 * | 12/2008 |
| KR | 10-20100052828 A | 5/2010 |
| KR | 10-2014-0017753 A | 2/2014 |
| KR | 10-2015-0002430 A | 1/2015 |
| TW | 454229 B | 9/2001 |

OTHER PUBLICATIONS

Korean Office Action for Korean Application No. 10-2015-0093162 dated Aug. 22, 2017.
Korean Office Action for Korean Application No. 10-2015-0093162 dated Apr. 19, 2018.
Chinese Office Action for Chinese Application No. 201610495650.7 dated Jul. 3, 2018.
Grant Notice for Korean Application No. 10-2015-0093162 dated Jul. 19, 2018.

* cited by examiner

METHOD AND APPARATUS FOR TREATING SUBSTRATE

CROSS-REFERENCE TO RELATED APPLICATION

A claim for priority under 35 U.S.C. § 119 is made to Korean Patent Application No. 10-2015-0093162 filed Jun. 30, 2015, in the Korean Intellectual Property Office, the entire content of which is incorporated by reference herein.

BACKGROUND

The inventive concept relates to a method and an apparatus for treating a substrate with a liquid.

In order to manufacture a semiconductor device or a liquid crystal display, various processes such as photolithography, ashing, ion implantation, thin film deposition, and cleaning are performed on a substrate. Among them, the cleaning process is a process of removing particles residing on the substrate, and is performed before and after the processes.

In general, in the process of cleaning the substrate, particles and foreign substances are removed by supplying a treatment liquid onto the substrate. In the process of cleaning the substrate, the treatment liquid is supplied to a central area of the substrate after the substrate is rotated. The treatment liquid is diffused from the central area of the substrate to the peripheral area of the substrate by a centrifugal force of the substrate to clean the entire area of the substrate.

However, the flow rate of the treatment liquid supplied to the central area of the substrate and the flow rate of the treatment liquid supplied to the peripheral are of the substrate are different. Accordingly, different cleaning forces are applied to the central area of the substrate and the peripheral area of the substrate.

Figure 1:
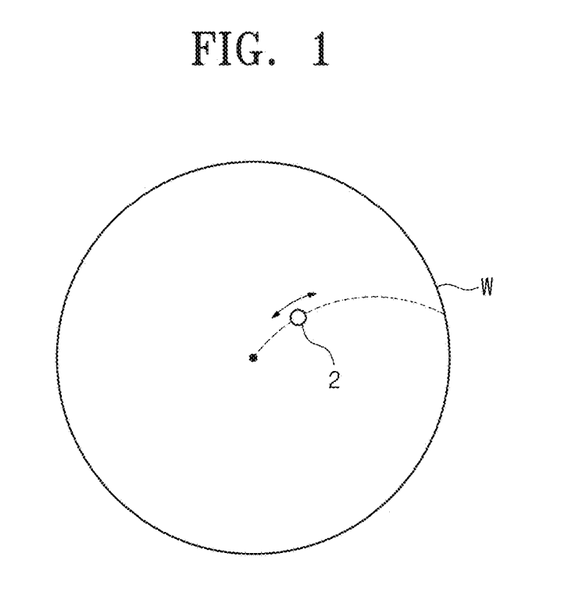
FIG. 1 is a plan view illustrating a general process of supplying a treatment liquid by a nozzle.
Figure 2:
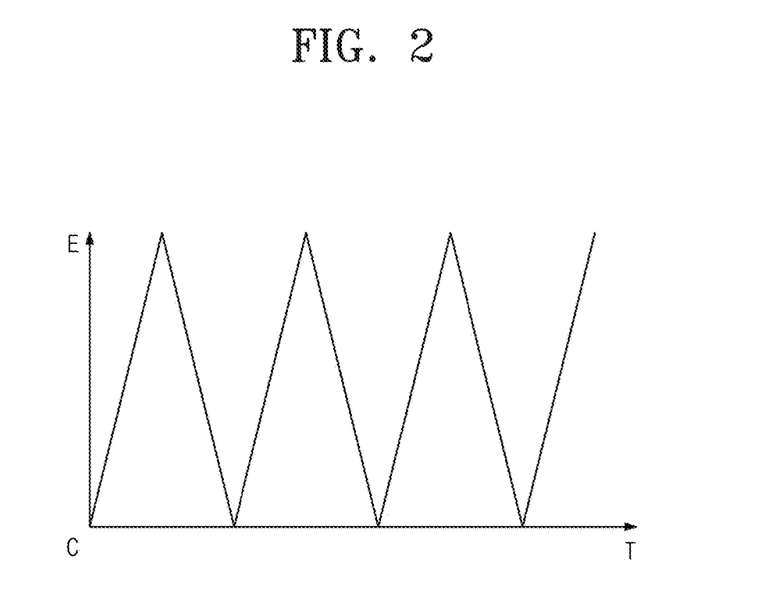
FIG. 2 is a graph depicting a supply location at which a treatment liquid is supplied to a substrate of FIG. 1 and a discharge height of the treatment liquid at which the treatment liquid is discharged.

In order to solve the solve the problem, as illustrated in FIGS. 1 and 2, the nozzle 2 supplies the treatment liquid while being reciprocally moved from a central area to a peripheral area of the substrate. However, the rotational speeds of the central area and the peripheral area of the substrate W become different. Accordingly, the treatment amounts per unit area by the treatment liquid are different in the central area and the peripheral area of the substrate.

SUMMARY

The inventive concept provides an apparatus and a method for uniformly providing a cleaning force for areas of a substrate.

The inventive concept also provides an apparatus and a method for uniformly providing a treatment amount per unit area of a substrate by a treatment liquid.

An embodiment of the inventive concept provides a method and an apparatus for treating a substrate with a liquid. In the method for treating a substrate with a treatment liquid, the substrate may be treated while a location (hereinafter, a supply location) at which the treatment liquid is supplied onto the substrate that is rotated is moved in an outward direction from a central area of the substrate towards a peripheral area of the substrate or in an inward direction from a peripheral area of the substrate towards a central area of the substrate a plurality of times, and the movement distances of some of the plurality of movements may be different from each other.

The movement distances become shorter as the number of the movements increases. In the movements, one end of a path of the supply location may be a peripheral area of the substrate. In the movements, ends of paths of the supply location may be the same locations.

An interval between a nozzle that discharges the treatment liquid and the substrate may vary according to the supply location. The interval may become shorter as the supply location goes outwards. The interval may become longer as the supply location goes inwards.

The discharge amounts of the treatment liquid may vary according to the supply location. The discharge amount of the treatment liquid may become larger as the supply location goes outwards. The discharge amount of the treatment liquid may become smaller as the supply location goes inwards.

The rotational speed of the substrate may vary according to the supply location. The rotational speed of the substrate may become higher as the supply location goes outwards. The rotational speed of the substrate may become lower as the supply location goes inwards.

The supply location may be alternately moved in the outward direction and the inward direction.

Further, in a method for treating a substrate with a treatment liquid, wherein the treatment liquid may be supplied to the substrate that is rotated, while being alternately moved in an outward direction from a central area of the substrate towards a peripheral area of the substrate and an inward direction from a peripheral area of the substrate towards a central area of the substrate, a process condition for treating the substrate may vary while the treatment liquid is supplied, and the process condition may include at least one of an interval between a nozzle that supplies the treatment liquid and the substrate, a discharge amount of the treatment liquid, a rotational speed of the substrate, and a movement speed of the nozzle according to a supply location of the treatment liquid.

An outward movement distance by which the supply location is moved outwards and an inward movement distance by which the supply location is moved inwards may become gradually shorter as the number of movements increases. The outward movement distance and the inward movement distance may include a peripheral area of the substrate. The interval between the nozzle and the substrate may become shorter as the supply location goes outwards. The interval between the nozzle and the substrate may become longer as the supply location goes inwards. The discharge amount of the treatment liquid may become larger as the supply location goes outwards. The discharge amount of the treatment liquid may become smaller as the supply location goes inwards. The rotational speed of the substrate may become higher as the supply location goes outwards. The rotational speed of the substrate may become lower as the supply location goes inwards.

An apparatus for treating a substrate includes a support plate that supports the substrate, a rotation driving member that rotates the support plate, a liquid supply unit having a nozzle that supplies the treatment liquid onto the substrate supported by the support plate and a movable member that moves the nozzle, and a controller that controls the rotation driving member and the movable member, and the controller controls the movable member such that the supply location at which the treatment liquid is supplied onto the substrate is moved in an outward direction from a central area of the substrate towards a peripheral area of the substrate and in an inward direction from the peripheral area of the substrate towards the central area of the substrate a plurality of times and some of the plurality of movements have different movement distances.

The controller may control the movable member such that one end of a path of the supply location includes a peripheral area of the substrate in the movements. The controller may control the movable member such that ends of the path of the supply location are the same in the movements, and the movement distances become shorter as the number of movements increases. The controller may control the movable member such that the interval between the nozzle and the substrate becomes shorter as the supply location goes outwards. The controller may control the movable member such that the interval between the nozzle and the substrate becomes longer as the supply location goes inwards. The controller may control the rotation driving member such that the rotational speed of the substrate becomes higher as the supply location goes outwards. The controller may control the rotation driving member such that the rotational speed of the substrate becomes lower as the supply location goes inwards.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

In the present embodiment, a process of cleaning a substrate will be described as an example. However, the present embodiment is not limited to the cleaning process, but may be variously applied to any process of liquid-treating a rotating substrate, such as an etching process, an ashing process, and a development process.

Hereinafter, exemplary embodiments of the inventive concept will be described with reference to FIGS. 3 to 10.

Figure 3:
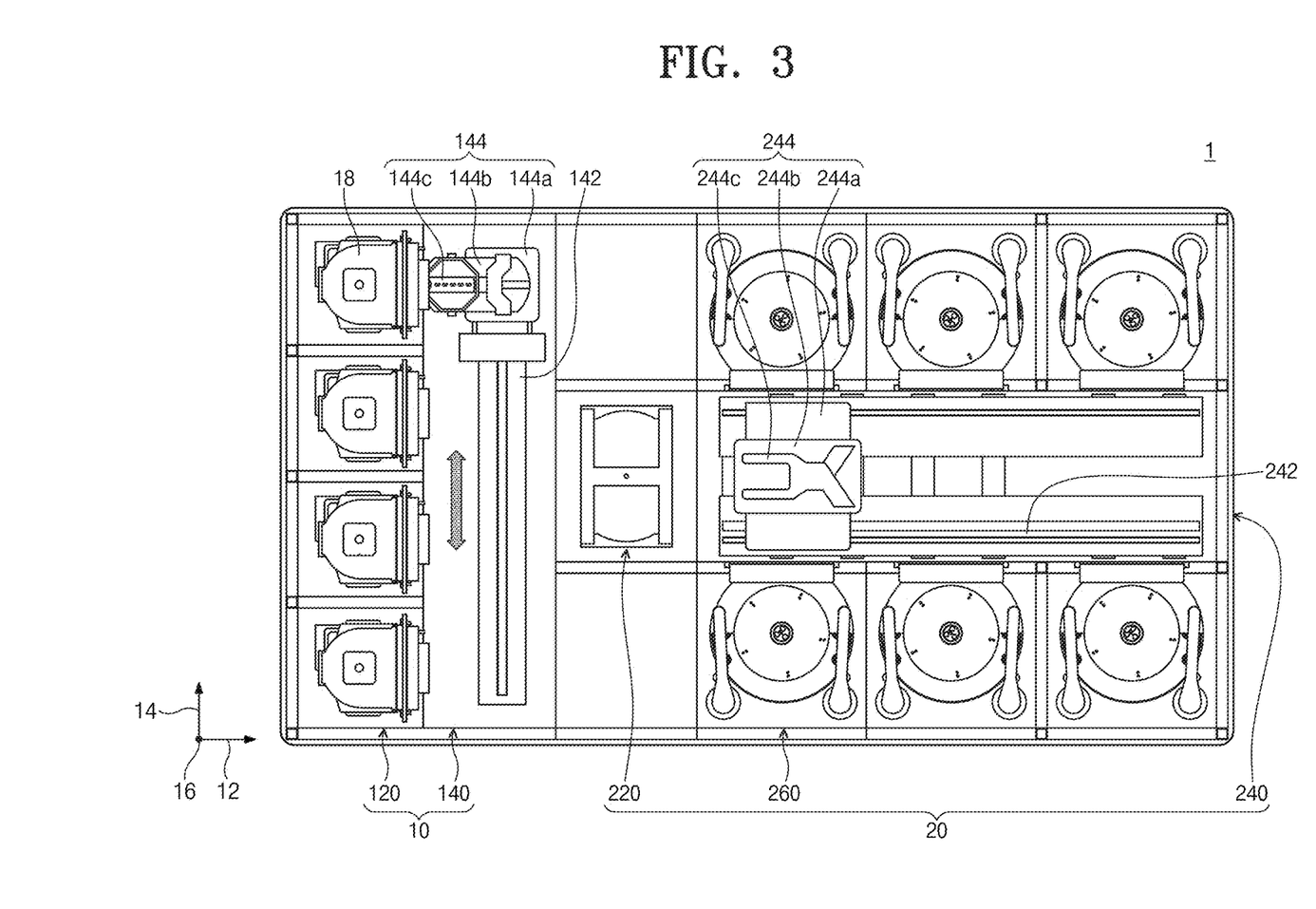
FIG. 3 is a plan view illustrating a substrate treating system according to a first embodiment of the inventive concept.

FIG. 3 is a plan view illustrating a substrate treating system according to a first embodiment of the inventive concept. Referring to FIG. 3, the substrate treating system 1 includes an index module 10 and a process treating module 20. The index module 10 includes a plurality of load ports 120 and a feeding frame 140. The load ports 120, the feeding frame 140, and the process treating module 20 may be sequentially arranged in a row. Hereinafter, a direction in which the load ports 120, the feeding frame 140, and the process treating module 20 are arranged will be referred to as a first direction 12, a direction that is perpendicular to the first direction 12 when viewed from the top will be referred to as a second direction 14, and a direction that is normal to a plane containing the first direction 12 and the second direction 14 will be referred to as a third direction 16.

A carrier 18, in which a substrate W is received, is seated on the load port 120. A plurality of load ports 120 are provided, and are arranged along the second direction 14 in a row. However, the number of the load ports 120 may increase or decrease according to a condition, such as the process efficiency of the process treating module 20 or a footprint. A plurality of slots (not illustrated) for receiving substrates W while the substrates W are arranged in parallel to the ground surface are formed in the carrier 18. A front opening unified pod (FOUP) may be used as the carrier 18.

The process treating module 20 includes a buffer unit 220, a feeding chamber 240, and a plurality of process chambers 260. The feeding chamber 240 is arranged such that the lengthwise direction thereof is in parallel to the first direction 12. Process chambers 260 are arranged on opposite sides of the feeding chamber 240. The process chambers 260 are provided on the opposite sides of the feeding chamber 240 to be symmetrical to each other with respect to the feeding chamber 240. A plurality of process chambers 260 are arranged on one side of the feeding chamber 240. Some of the process chambers 260 are arranged along the lengthwise direction of the feeding chamber 240. Furthermore, some of the process chambers 260 are arranged to be stacked on each other. That is, the process chamber 260 having an array of A by B may be arranged on one side of the feeding chamber 240. Here, A is the number of the process chambers 260 provided in a row along the first direction 12, and B is the number of the process chambers 260 provided in a row along the third direction 16. When four or six process chambers 260 are provided on one side of the feeding chamber 240, the process chambers 260 may be arranged in an array of 2 by 2 or 3 by 2. The number of the process chambers 260 may increase or decrease. Unlike the above-mentioned description, the process chambers 260 may be provided only on one side of the feeding chamber 240.

Further, the process chambers 260 may be provided on one side or opposite sides of the feeding chamber 240 to form a single layer.

The buffer unit 220 is disposed between the feeding frame 140 and the feeding chamber 240. The buffer unit 220 provides a space in which the substrates W stay before being transported, between the feeding chamber 240 and the feeding frame 140. A plurality of slots (not illustrated) in which the substrates W are positioned are provided in the interior of the buffer unit 220. A plurality of slots (not illustrated) may be provided to be spaced apart from each other along the third direction 16. A face of the buffer unit 220 that faces the feeding frame 140 and a face of the buffer unit 220 that faces the feeding chamber 240 are opened.

The feeding frame 140 transports the substrates W between the carrier 18 seated on the load port 120 and the buffer unit 220. An index rail 142 and an index robot 144 are provided in the feeding frame 140. The index rail 142 is arranged such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is provided to be moved along the third direction 16 on the base 144a. The body 144b is provided to be rotated on the base 144a. The index arms 144c are coupled to the body 144b, and are provided to be moved forwards and rearwards with respect to the body 144b. A plurality of index arms 144c are provided to be driven individually. The index arms 144c are arranged to be stacked so as to be spaced apart from each other along the third direction 16. Some of the index arms 144c are used when the substrates W are transported to the carrier 18 in the process module 20, and some of the index arms 144c may be used when the substrates W are transported from the carrier 18 to the process treating module 20. This structure may prevent particles generated from the substrates W before the process treatment from being attached to the substrates W after the process treatment in the process of carrying the substrates W in and out by the index robot 144.

The feeding chamber 240 transports the substrates W between the buffer unit 220 and the process chambers 260, and between the process chambers 260. A guide rail 242 and a main robot 244 are provided in the feeding chamber 240. The guide rail 242 is disposed such that the lengthwise direction thereof is parallel to the first direction 12. The main robot 244 is installed on the guide rail 242, and is linearly moved along the first direction 12 on the index rail 242. The main robot 244 has a base 244a, a body 244b, and a plurality of main arms 244c. The base 244a is installed to be moved along the guide rail 242. The body 244b is coupled to the base 244a. The body 244b is provided to be moved along the third direction 16 on the base 244a. The body 244b is provided to be rotated on the base 244a. The main arms 244c are coupled to the body 244b, and are provided to be moved forwards and rearwards with respect to the body 244b. A plurality of main arms 244c are provided to be driven individually. The main arms 244c are arranged to be stacked so as to be spaced apart from each other along the third direction 16.

Substrate treating apparatuses 300 that perform cleaning processes on the substrates W are provided in the process chambers 260. The substrate treating apparatus 300 may have different structures according to the types of the cleaning processes. Alternatively, the substrate treating apparatuses 300 in the process chambers 260 may have the same structure. Selectively, the process chambers 260 may be classified into a plurality of groups such that the structures of the substrate treating apparatuses 300 in the process chambers 260 pertaining to the same group are the same and the structures of the substrate treating apparatuses 300 in the process chambers 260 pertaining to different groups are different.

Figure 4:
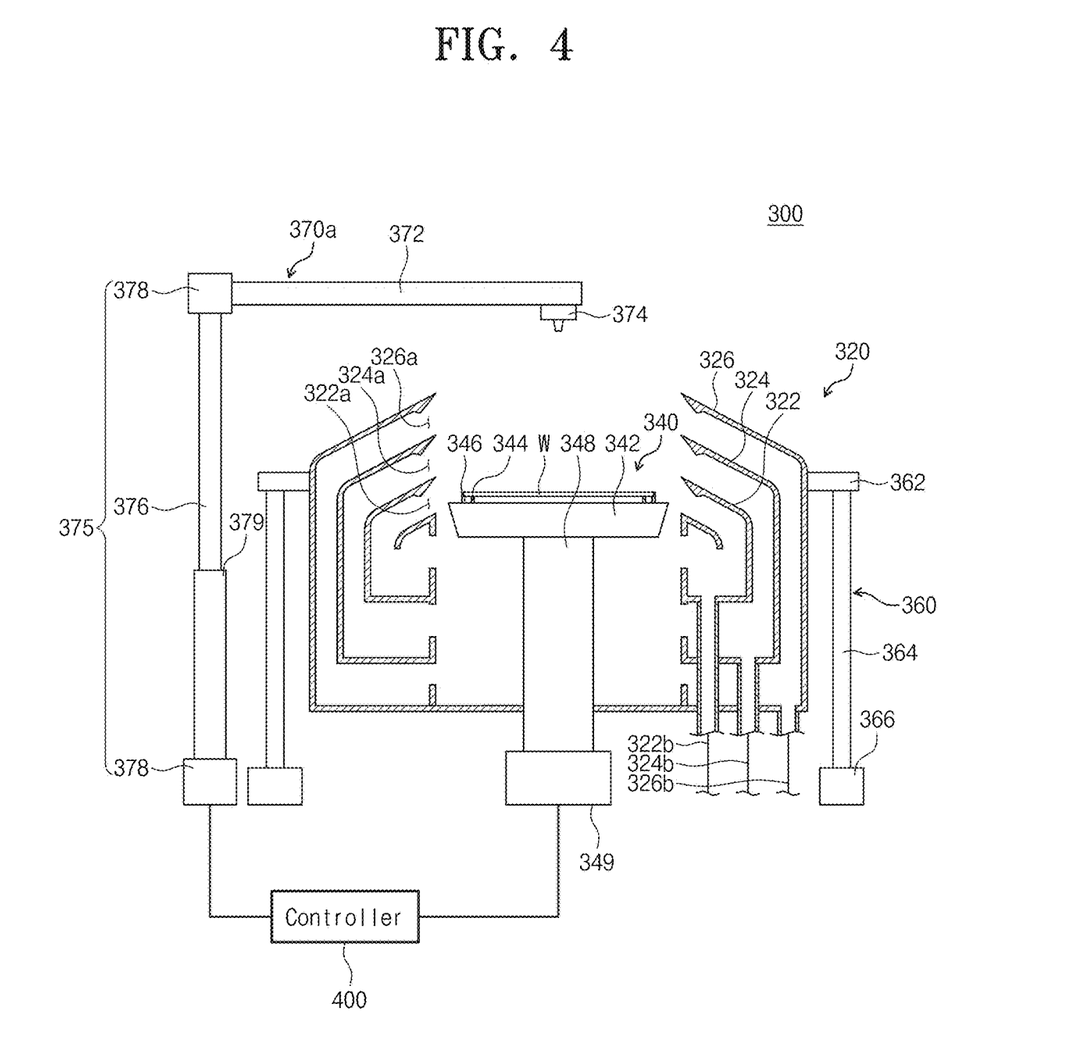
FIG. 4 is a sectional view illustrating the substrate treating apparatus of FIG. 3.

FIG. 4 is a sectional view illustrating a substrate treating apparatus of FIG. 3. Referring to FIG. 4, the substrate treating apparatus 300 includes a container 320, a substrate support unit 340, an elevation unit 360, a liquid supply unit 370, and a controller 400.

The container 320 has a treatment space in the interior thereof, and has an open-topped tub shape. The container 320 has an inner recovery vessel 322, an intermediate recovery vessel 324, and an outer recovery vessel 326. The recovery vessels 322, 324, and 326 recover different treatment liquids used in the process. The inner recovery vessel 322 has an annular ring shape that surrounds the substrate support unit 340, the intermediate recovery vessel 324 has an annular ring shape that surrounds the inner recovery vessel 322, and the outer recovery vessel has an annular ring shape that surrounds the intermediate recovery vessel 324. An inner space 322a of the inner recovery vessel 322 functions as a first inlet 322a, through which the treatment liquid is introduced. A space 324a between the intermediate recovery vessel 324 and the inner recovery vessel 322 functions as a second inlet 324a, through which the treatment liquid is introduced into the intermediate recovery vessel 324. A space 326a between the intermediate recovery vessel 324 and the outer recovery vessel 326 functions as a third inlet 326a, through which the treatment liquid is introduced into the outer recovery vessel 326. According to an embodiment, the inlets 322a, 324a, and 326a may be situated at different heights. Recovery lines 322b, 324b, and 326b are connected to the bottom surfaces of the recovery vessels 322, 324, and 326 below the recovery vessels 322, 324, and 326. The recovery lines 322b, 324b, and 326b separate and recover the liquids introduced into the recovery vessels 322, 324, and 326.

The substrate supporting unit 340 supports the substrate W. The substrate supporting unit 340 rotates the substrate W during the process. The substrate support unit 340 has a body 342, a plurality of support pins 344, a plurality of chuck pins 346, and a rotation driving member 348 and 349. The body 342 has an upper surface and a lower surface that are cylindrical. The lower surface of the body 342 has a diameter that is smaller than that of the upper surface of the body 342. The central axes of the upper surface and the lower surface of the body 342 coincide with each other.

A plurality of support pins 344 are provided. The support pins 344 may be arranged to be spaced apart from each other at a periphery of the upper surface of the body 342 and protrude upwards from the body 342. The support pins 344 are arranged to have a generally annular ring shape through combination thereof. The support pins 344 support a periphery of a rear surface of the substrate W such that the substrate W is spaced apart from the upper surface of the body 342 by a predetermined distance.

A plurality of chuck pins 346 are provided. The chuck pins 346 are arranged to be more distant from the center of the body 342 than the support pins 344. The chuck pins 346 are provided to protrude upwards from the body 342. The chuck pins 346 support a side of the substrate W such that the substrate W is not separated laterally from a proper place when the substrate W is rotated. The chuck pins 346 are provided to be linearly moved between a standby position and a support position along a radial direction of the body 342. The standby position is a position that is more distant from the center of the body 342 than the support position. When the substrate W is loaded on or unloaded from the substrate support unit 340, the chuck pins 346 are located at the standby position, and when a process is performed on the substrate W, the chuck pins 346 are located at the support position. The chuck pins 346 are in contact with the side of the substrate W at the support position.

The rotation driving member 348 and 349 rotate the body 342. The rotation driving member 348 and 349 includes a support shaft 348 and a driver 349. The support shaft 348 has a rod shape that faces the third direction 16. The support shaft 348 is fixedly coupled to a lower surface of the body 342. The driver 349 rotates the support shaft 348. As the support shaft 348 is rotated by the driver 349, the body 342 is rotated together with the support shaft 348.

The elevation unit 360 adjusts a relative height between the container 320 and the substrate support unit 340. The elevation unit 360 linearly moves the container 320 upwards and downwards. When the container 320 is moved upwards and downwards, a relative height of the container 320 to the substrate support unit 340 is changed. The elevation unit 360 has a bracket 362, a movable shaft 364, and a driver 366. The bracket 362 is fixedly installed on an outer wall of the container 320, and the movable shaft 364 that is moved upwards and downwards by the driver 366 is fixedly coupled to the bracket 362. The container 320 is lowered such that the substrate support unit 340 protrudes to the upper side of the container 320 when the substrate W is loaded onto or unloaded from the substrate support unit 340. When the process is performed, the height of the container 320 is adjusted such that the treatment liquid is introduced into the preset recovery vessel 360 according to the kind of the treatment liquid supplied to the substrate W. Selectively, the height of the container 320 may be fixed and the body 342 of the substrate support unit 340 may be moved upwards and downwards.

The liquid supply unit 370 supplies a treatment liquid onto the substrate W. The liquid supply unit 370 includes a movable member 375, a height adjusting member 379, and a nozzle 374. The movable member 375 moves the nozzle 374 between a process location and a standby location. Here, the process location is defined as a location at which the nozzle 374 faces a substrate W supported by the substrate support unit 340, and the standby location 374 is defined as a location at which the nozzle 374 deviates from the process location. Further, the movable member 375 moves the nozzle 374 at the process location such that the treatment liquid is supplied at different supply locations. According to an embodiment, the movable member 375 may move the nozzle 374 such that the supply location of the treatment liquid may move from a central area of the substrate W in an outward direction that faces a peripheral area of the substrate W. Further, the movable member 375 may move the nozzle 374 such that the supply location of the treatment liquid may move from a peripheral area of the substrate W in an inward direction that faces a central area of the substrate W.

The movable member 375 includes a rotary shaft 372, a support arm 372, and a driver 378. The rotary shaft 376 is situated on one side of the container 320. The rotary shaft 376 has a rod shape, the length of which faces the third direction 16. The rotary shaft 376 may be rotated by the driver 378. The rotary shaft 376 may be rotated about the central axis thereof by a driving force provided by the driver 378. The support arm 372 connects the nozzle 374 and the rotary shaft 376. As the rotary shaft 376 is rotated, the support arm 372 and the nozzle 374 may be rotated and swung about the central axis of the rotary shaft 376.

The support arm 372 has a rod shape, the lengthwise direction of which faces a horizontal direction that is perpendicular to the third direction 16. One end of the support arm 372 is fixedly coupled to an upper end of the rotary shaft 376. An opposite end of the support arm 372 may be rotated about the end of the support arm 372, which is coupled to the rotary shaft 376. According to an embodiment, when viewed from the top, a path in which the opposite end of the support arm 372 is moved may pass through a central area of the substrate W. The nozzle 374 is coupled to the opposite end of the support arm 372. Accordingly, the nozzle 374 may be moved from a process location to a standby location as the rotary shaft 376 and the support arm 372 are rotated. Selectively, the movable member 375 may further include a guide rail that linearly moves the support arm 372 in the first direction 12 or the second direction 14.

The height adjusting member 379 variously adjusts the height of the nozzle 374. The height adjusting member 379 adjusts the height of the nozzle 374 by moving the rotary shaft 376 upwards and downwards. The height adjusting member 379 supports a lower end of the rotary shaft 376 while surrounding the rotary shaft 376. For example, the height adjusting member 379 may be a motor.

The nozzle 374 discharges the treatment liquid. A discharge hole is formed at a lower end of the nozzle 374, and the discharge hole faces the lower side. For example, the discharge hole may extend in a direction parallel to the third direction 16.

For example, the treatment liquid may include various types of liquids. The treatment liquid may be a chemical and a rinsing liquid. The chemical may be a liquid including sulfuric acid ($H_2SO_4$), phosphoric acid ($P_2O_5$), hydrofluoric acid (HF), and ammonium fluoride ($NH_4F$). The rinsing liquid may be pure water. A plurality of liquid supply units 370 may be provided to correspond to the types of the liquids supplied onto the substrate W, respectively. Selectively, a single liquid supply unit 370 may supply various types of liquids.

The controller 400 controls the liquid supply unit 370 and the substrate support unit. The controller 400 controls the rotation driving member 348 and 349 such that the substrate W may be rotated when the substrate W is liquid-treated. Further, the controller 400 controls the movable member 375 such that the supply location at which the treatment liquid is supplied onto the substrate W may be moved in an outward direction from a central area of the substrate W towards a peripheral area of the substrate W and in an inward direction from the peripheral area of the substrate W towards the central area of the substrate W, a plurality of times. The controller 400 controls the movable member 375 such that some of the plurality of inward and outward movements are different. According to an embodiment, the controller 400 may control the movable member 375 such that the inward movements of the supply location, in which the supply location of the treatment liquid is moved inwards, and the outward movements of the supply location, in which the supply location of the treatment liquid is moved outwards, may be alternately performed. The controller 400 may control the movable member 375 such that the distances of the outward movements and the distances of the inward movements become gradually shorter as the number of the inward movements and the number of the outward movements increase.

Figure 5:
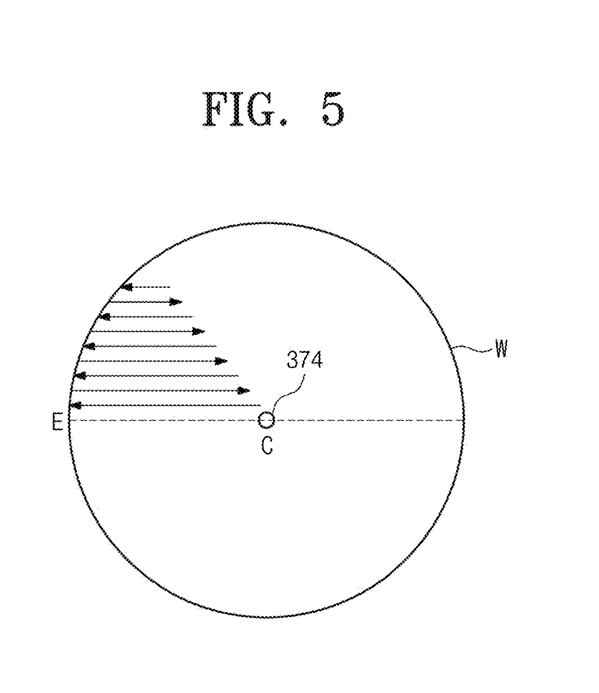
FIG. 5 is a plan view illustrating a process of treating a substrate in the substrate treating apparatus of FIG. 3.
Figure 6:
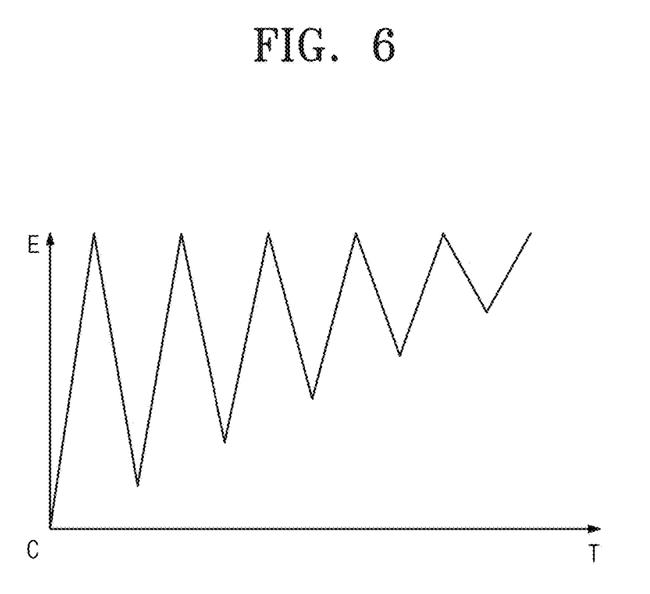
FIG. 6 is a graph depicting a supply location at which a treatment liquid is supplied to a substrate of FIG. 5 and a movement distance of the supply location.

Next, a method for treating a substrate W by using the aforementioned substrate treating apparatus will be described. FIG. 5 is a plan view illustrating a process of treating a substrate in the substrate treating apparatus of FIG. 3. FIG. 6 is a graph depicting a supply location at which a treatment liquid is supplied to a substrate of FIG. 5 and a movement distance of the supply location. Referring to FIGS. 5 and 6, the substrate W is loaded onto the substrate support unit 340, and is rotated at a predetermined speed as the support shaft 348 is rotated. The nozzle 374 is moved such that the supply location of the treatment liquid coincides with a central area of the substrate W. The nozzle 374 discharges the treatment liquid, and is moved outwards. If the supply location of the treatment liquid reaches a peripheral area of the substrate W, it is moved in an inward direction that is opposite to the outward direction. In this way, the outward movements and the inward movements are alternately performed a plurality of times. As the number of the movements increases, the nozzle 374 is moved such that the movement distances become gradually shorter. The nozzle 374 is moved such that in the movements, one end of a path of the supply location is a peripheral area of the substrate, and ends of paths of the supply location are the same locations. Accordingly, as the number of the movements increases, the supply location of the treatment liquid becomes more distant from the central area of the substrate W. That is, because the peripheral area of the substrate W has an area that is larger than that of the central area, a large amount of treatment liquid may be supplied to the peripheral area as compared with the central area of the substrate W to uniformly provide a treatment amount per unit area according to the areas.

Figure 7:
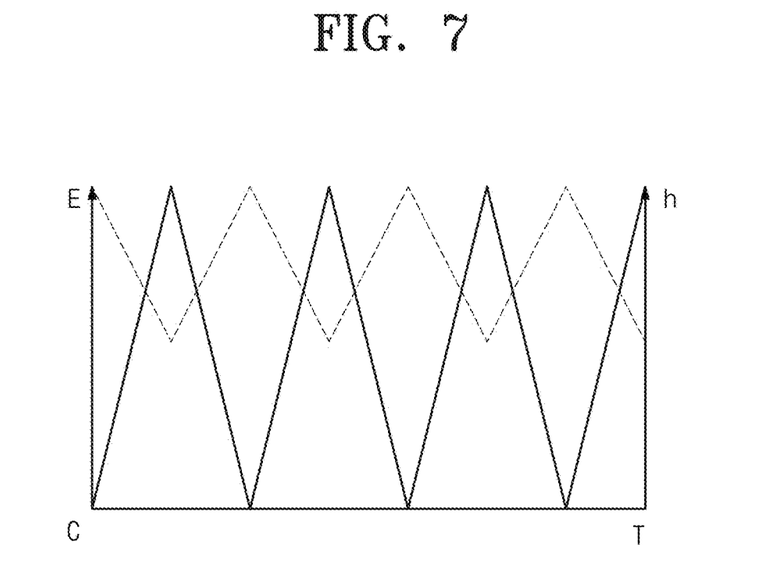
FIG. 7 is a graph depicting a supply location at which a treatment liquid is supplied to the substrate of FIG. 5 and a discharge height of the treatment liquid at which the treatment liquid is discharged according to a second embodiment of the inventive concept.

Next, a second embodiment of a method for treating a substrate will be described. According to the second embodiment, the height h of the nozzle 374 may be different according to a supply location of the treatment liquid. That is, an interval between the nozzle 374 and the substrate W may be different according to the supply location of the treatment liquid. The controller 400 may control the height adjusting member 379 such that the height h of the nozzle 374 may be adjusted. Referring to FIG. 7, the substrate W may be loaded onto the substrate support unit 340, and may be rotated at a predetermined speed as the support shaft 348 is rotated. The nozzle 374 may be moved such that the supply location of the treatment liquid coincides with a central area of the substrate W. The nozzle 374 discharges the treatment liquid, and may be alternately moved inwards and outwards. The height of the nozzle 374 may be lowered as the supply location of the treatment liquid becomes closer to a peripheral area of the substrate W. That is, the interval between the nozzle 374 and the substrate W may become larger inwards and become smaller outwards. Accordingly, a strong treatment force is provided to a peripheral area of the substrate W as compared to a central area of the substrate W to uniformly provide a treatment amount per unit area according the areas.

Figure 8:
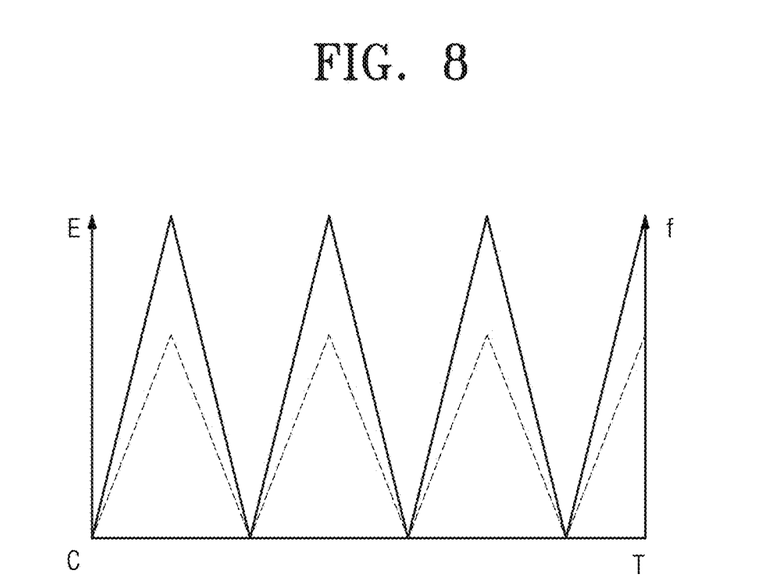
FIG. 8 is a graph depicting a supply location at which a treatment liquid is supplied to the substrate of FIG. 5 and a discharge amount of the treatment liquid according to a third embodiment of the inventive concept.

Next, a third embodiment of a method for treating a substrate will be described. According to the third embodiment, the discharge amount f of the treatment liquid may be different according to the supply location. The controller 400 may control a discharge amount f of the treatment liquid by controlling a valve (not illustrated) installed in a liquid supply line (not illustrated) connected to the nozzle 374. Referring to FIG. 8, the substrate W may be loaded onto the substrate support unit 340, and may be rotated at a predetermined speed as the support shaft 348 is rotated. The nozzle 374 may be moved such that the supply location of the treatment liquid coincides with a central area of the substrate W. The nozzle 374 discharges the treatment liquid and may be alternately moved inwards and outwards. The discharge amount f of the treatment liquid becomes larger as the supply location of the treatment liquid becomes closer to a peripheral area of the substrate W. To the contrary, the discharge amount f of the treatment liquid become smaller as the supply location of the treatment liquid becomes closer to a central area of the substrate W. Accordingly, a large amount of treatment liquid and a strong treatment force may be provided to a peripheral area of the substrate W as compared to a central area of the substrate W to uniformly provided a treatment amount per unit area according the areas.

Figure 9:
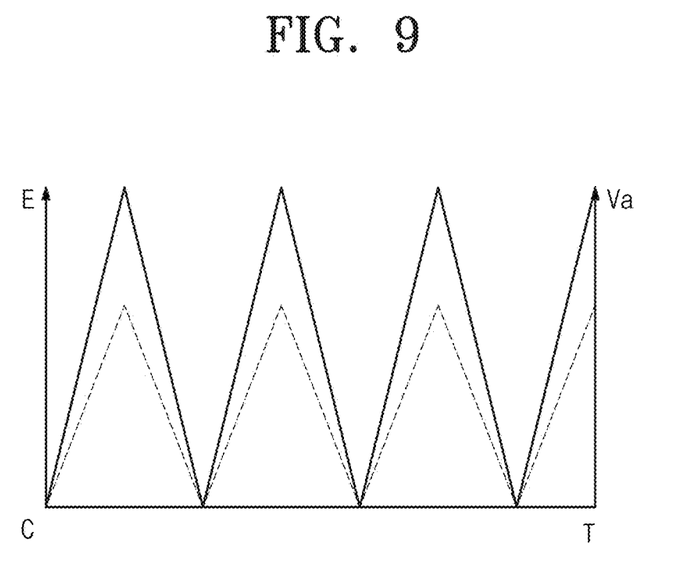
FIG. 9 is a graph depicting a supply location at which a treatment liquid is supplied to the substrate of FIG. 5 and a rotational speed of the substrate according to a fourth embodiment of the inventive concept.

Next, a fourth embodiment of a method for treating a substrate will be described. According to the fourth embodiment, the rotational speed Va of the substrate W may be different according to a supply location of the treatment liquid. The controller 400 may control the rotation driving member 348 and 349 such that the rotational speed Va of the substrate W may be adjusted. Referring to FIG. 9, the substrate W may be loaded onto the substrate support unit 340 and may be rotated at a predetermined speed as the support shaft 348 is rotated. The nozzle 374 may be moved such that the supply location of the treatment liquid coincides with a central area of the substrate W. The nozzle 374 discharges the treatment liquid and may be alternately moved inwards and outwards. The rotational speed Va of the substrate W may become higher as the supply location of the treatment liquid become closer to the peripheral area of the substrate W. The rotational speed Va of the substrate W may become lower as the supply location of the treatment liquid become closer to the central area of the substrate W. Accordingly, a contact area of the treatment liquid may be provided to a peripheral area of the substrate W as compared to a central area of the substrate W to uniformly provided a treatment amount per unit area according the areas.

Figure 10:
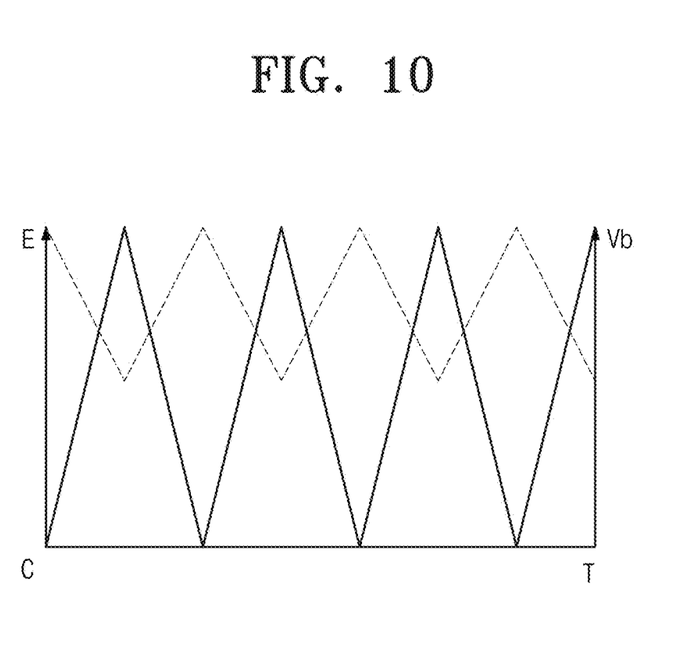
FIG. 10 is a graph depicting a supply location at which a treatment liquid is supplied to the substrate of FIG. 5 and a movement speed of a nozzle according to a fifth embodiment of the inventive concept.

Next, a fifth embodiment of a method for treating a substrate will be described. According to the fifth embodiment, the movement speed Vb of the nozzle 374 may be different according to a supply location of the treatment liquid. The controller 400 may control the movable member 375 such that the movement speed Vb of the nozzle 374 may be adjusted. Referring to FIG. 10, the substrate W may be loaded onto the substrate support unit 340 and may be rotated at a predetermined speed as the support shaft 348 is rotated. The nozzle 374 may be moved such that the supply location of the treatment liquid coincides with a central area of the substrate W. The nozzle 374 discharges the treatment liquid and may be alternately moved inwards and outwards. The movement speed Vb of the nozzle 374 may become lower as the supply location of the treatment liquid become closer to the peripheral area of the substrate W. The movement speed Vb of the nozzle 374 may become higher as the supply location of the treatment liquid become closer to the central area of the substrate W. Accordingly, a large amount of treatment liquid is supplied to a peripheral area of the substrate W as compared to a central area of the substrate W to uniformly provided a treatment amount per unit area according the areas.

The embodiments of the inventive concept are not limited to the aforementioned ones, which may be coupled to each other to be complexly performed. For example, some of the height h of the nozzle 374, the discharge amount f of the treatment liquid, the rotational speed Va of the substrate W, and the movement speed Vb of the nozzle may vary as the outward movement distance and the inward movement distance become gradually shorter as the number of movements of the nozzle 374 increases.

Further, two or more of the movement distance of the nozzle 374, the height h of the nozzle 374, the discharge amount f of the treatment liquid, the rotational speed Va of the substrate W, and the movement speed Vb of the nozzle 374 may vary at the same time according to the supply location of the treatment liquid.

According to an embodiment of the inventive concept, a larger amount of treatment liquid is supplied to a peripheral area of the substrate than to a central area of the substrate. Accordingly, the areas of the substrate may be uniformly cleaned.

Further, according to an embodiment of the inventive concept, the discharge height of the nozzle may be different for the areas of the substrate. Accordingly, the treatment amount per unit area of the substrate may be uniformly provided.

Further, according to an embodiment of the inventive concept, the discharge amount of the treatment liquid may be different for the areas of the substrate. Accordingly, the treatment amount per unit area of the substrate may be uniformly provided.

Further, according to an embodiment of the inventive concept, the rotational speed of the substrate may be different according to the supply location of the treatment liquid. Accordingly, the treatment amount per unit area of the substrate may be uniformly provided.

Further, according to an embodiment of the inventive concept, the movement speed of the nozzle may be different according to the supply location of the treatment liquid. Accordingly, the treatment amount per unit area of the substrate may be uniformly provided.

What is claimed is:

1. A method for treating a substrate with a treatment liquid, wherein the substrate is treated while a supply location at which the treatment liquid is supplied onto the substrate that is rotated is moved in an outward direction from a central area of the substrate towards a peripheral area of the substrate or in an inward direction from a peripheral area of the substrate towards a central area of the substrate a plurality of times to form a plurality of outward and inward movements of the supply location, and wherein movement distances of the plurality of outward and inward movements of the supply location become shorter as a number of the outward and inward movements of the supply location increases.

2. The method of claim 1, wherein in the plurality of outward and inward movements of the supply location, one end of a path of the supply location is the peripheral area of the substrate.

3. The method of claim 1, wherein in the plurality of outward and inward movements of the supply location, the outward and inward movements end at a same location.

4. The method of claim 1, wherein an interval between a nozzle that discharges the treatment liquid and the substrate varies according to the supply location.

5. The method of claim 1, wherein a discharge amount of the treatment liquid varies according to the supply location.

6. The method of claim 1, wherein a rotational speed of the substrate varies according to the supply location.

7. The method of claim 4, wherein the interval becomes shorter as the supply location goes outwards.

8. The method of claim 4, wherein the interval becomes longer as the supply location goes inwards.

9. The method of claim 5, wherein a discharge amount of the treatment liquid becomes larger as the supply location goes outwards.

10. The method of claim 5, wherein a discharge amount of the treatment liquid becomes smaller as the supply location goes inwards.

11. The apparatus of claim 6, wherein the rotational speed of the substrate becomes higher as the supply location goes outwards.

12. The method of claim 6, wherein the rotational speed of the substrate becomes lower as the supply location goes inwards.

* * * * *